United States Patent [19]

Steele et al.

[11] Patent Number: 4,606,000
[45] Date of Patent: Aug. 12, 1986

[54] BRIDGE RECTIFIER

[75] Inventors: Roy B. Steele, Richmond; Thomas E. Kirk, Anderson; Melvin T. Robinson, Anderson; Stephen W. Anderson, Anderson, all of Ind.

[73] Assignee: General Motors Corporation, Detroit, Mich.

[21] Appl. No.: 716,704

[22] Filed: Mar. 27, 1985

[51] Int. Cl.$^4$ .............................................. H02M 1/00
[52] U.S. Cl. ..................................... 363/145; 363/141; 310/68 D
[58] Field of Search ................. 363/141, 144, 145; 310/68 D; 411/500, 525–528, 907, 908

[56] References Cited

U.S. PATENT DOCUMENTS

| | | |
|---|---|---|
| 1,971,881 | 8/1934 | Tinnerman .......................... 411/525 |
| 2,927,497 | 3/1960 | Rapata ................................ 411/525 |
| 3,173,038 | 3/1965 | Brown .......................... 363/141 X |
| 3,377,525 | 4/1968 | Bradstock . |
| 3,527,972 | 9/1970 | Franz et al. ...................... 310/68 D |
| 3,538,362 | 11/1970 | Cheetham et al. .............. 310/68 D |
| 3,539,850 | 11/1970 | Sato .......................................... 310/68 |
| 3,629,630 | 12/1971 | Cotton .............................. 310/68 D |
| 3,629,631 | 12/1971 | Cotton .............................. 310/68 D |
| 3,648,121 | 3/1972 | Suenaga et al. . |
| 3,697,814 | 10/1972 | Christman et al. .......... 363/141 X |
| 3,738,422 | 6/1973 | Economos . |
| 3,739,209 | 6/1973 | Drabik ........................ 310/68 D X |
| 3,793,570 | 2/1974 | Crouch et al. . |
| 3,812,390 | 5/1974 | Richards ........................... 310/68 D |
| 3,831,062 | 8/1974 | Haug et al. . |
| 3,846,824 | 11/1974 | Bell ...................................... 357/80 |
| 3,870,944 | 3/1975 | Ogawa et al. . |
| 3,927,338 | 12/1975 | Vieilleribiere ................ 363/144 X |
| 3,959,676 | 5/1976 | Striker ............................ 363/145 X |
| 3,979,659 | 9/1976 | Lynch, Jr. et al. . |
| 4,059,778 | 11/1977 | Sohnle .............................. 310/68 D |
| 4,065,686 | 12/1977 | Moore .............................. 310/68 D |
| 4,079,410 | 3/1978 | Schierz ........................... 363/141 X |
| 4,103,193 | 7/1978 | Ito .................................... 310/68 D |
| 4,137,560 | 1/1979 | Moore .................................. 363/145 |
| 4,169,282 | 9/1979 | Allport et al. ..................... 363/145 |
| 4,189,653 | 2/1980 | Hirutaka et al. ................. 310/68 D |
| 4,218,694 | 8/1980 | Grzybowski .......................... 357/76 |
| 4,232,238 | 11/1980 | Saito ................................. 310/68 D |
| 4,303,935 | 12/1981 | Ragaly ................................. 357/76 |
| 4,305,121 | 12/1981 | Lack et al. ......................... 363/141 |
| 4,321,664 | 3/1982 | Matthai .............................. 363/141 |
| 4,460,956 | 7/1984 | Hamasaki ......................... 363/141 |
| 4,506,320 | 3/1985 | Koroncai et al. ............. 363/144 X |
| 4,543,504 | 9/1985 | Iwaki et al. .................... 363/145 X |

Primary Examiner—Patrick R. Salce
Assistant Examiner—Marc S. Hoff
Attorney, Agent, or Firm—C. R. Meland

[57] ABSTRACT

A bridge rectifier for a diode-rectified alternating current generator that is comprised of two metallic heat sinks formed respectively of copper and aluminum that are separated by an electrical insulator. Each heat sink carries a plurality of semiconductor diode chips. The diode chips are electrically connected to electrical connectors that are insert molded to insulator blocks that are supported by one of the heat sinks. The electrical connectors are adapted to be connected to the phase windings of an alternating current generator. The aluminum heat sink has a finned area which is adapted to be contacted by cooling air when the bridge rectifier is mounted in the generator.

6 Claims, 25 Drawing Figures

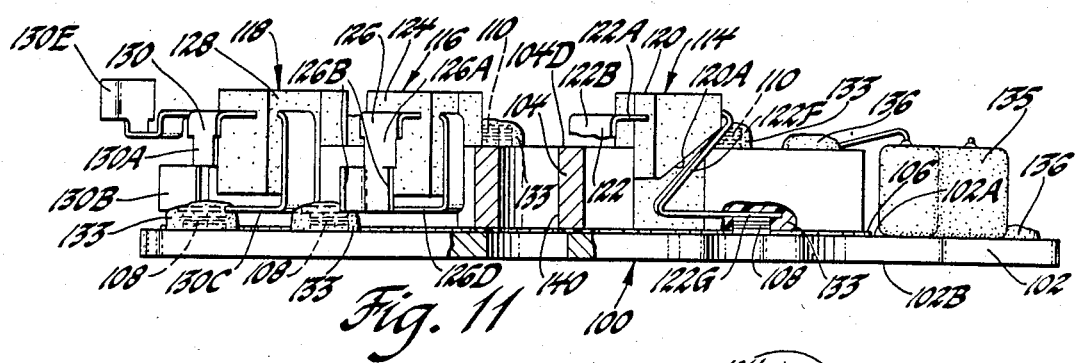
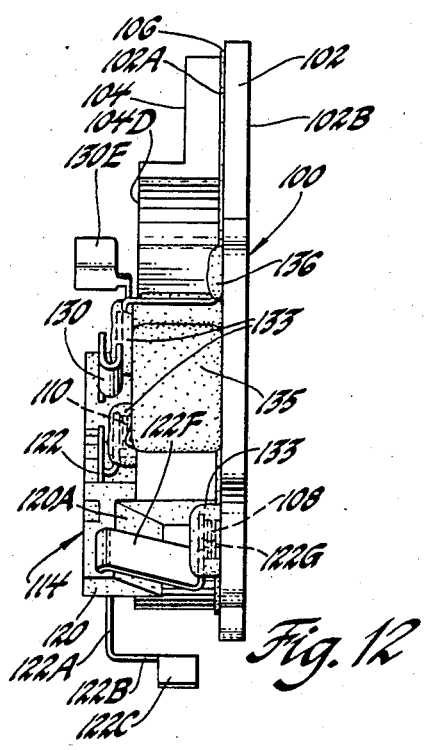
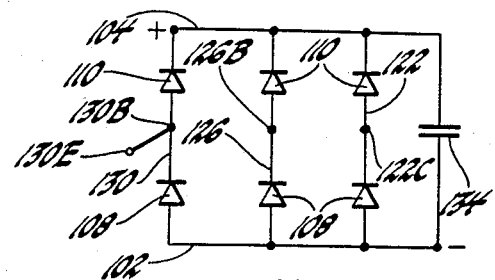
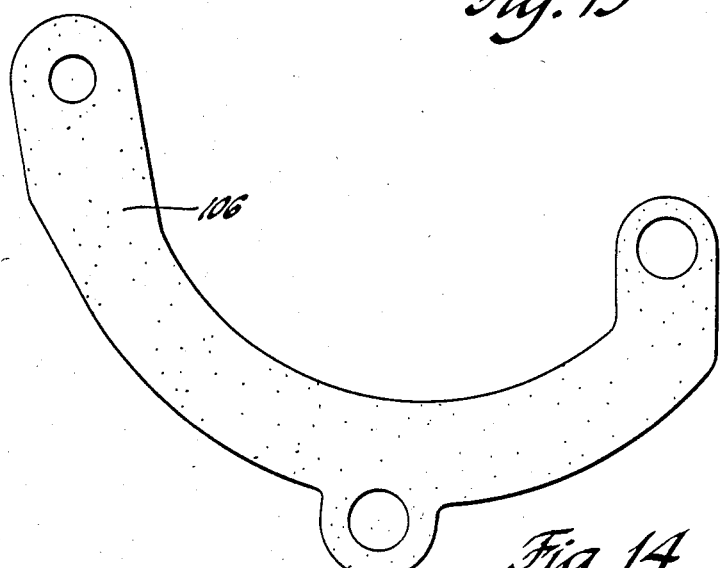
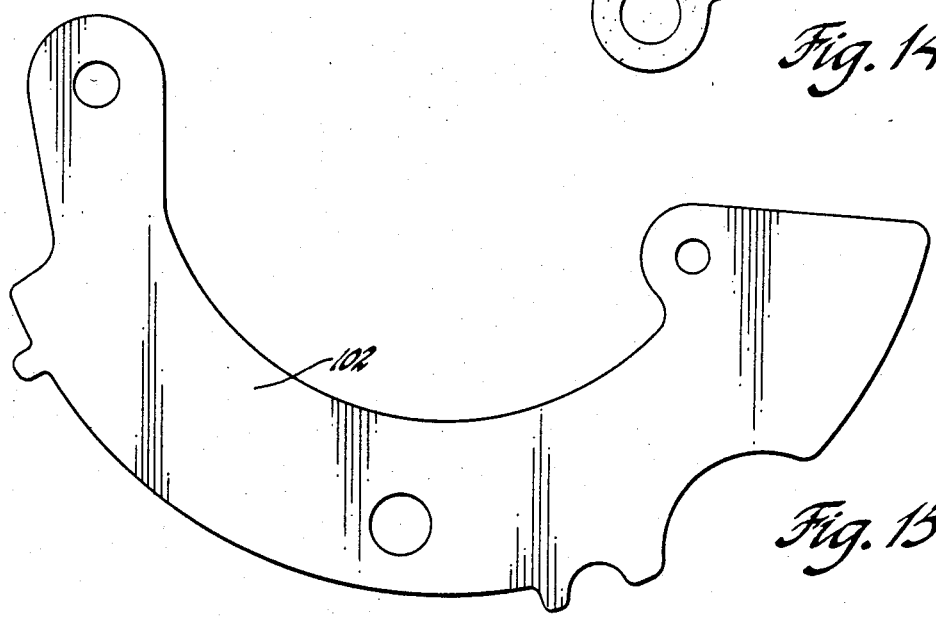

BRIDGE RECTIFIER

This invention relates to bridge rectifiers for rectifying the alternating current output of an alternating current generator and more particularly to a bridge rectifier for use with a motor vehicle alternator for providing a direct voltage to the electrical loads of the vehicle.

Bridge rectifiers for motor vehicle diode-rectified alternators are well known to those skilled in the art. In general, they are comprised of two metal parts that are electrically insulated from each other. Each metal part carries a plurality of semiconductor diodes which are arranged such that the two metal parts form respective positive and negative direct voltage output terminals. Pairs of diodes are connected to respective phase windings of the output winding of the alternating current generator. A bridge rectifier of the type described and the manner in which it is mounted to an end frame of an alternating current generator is disclosed in the U.S. Pat. No. 3,538,362 to Cheetham et al., granted on Nov. 3, 1970.

In contrast to the bridge rectifier disclosed in the above-referenced Cheetham et al. patent it is an object of this invention to provide an improved bridge rectifier that utilizes semiconductor diode chips that are mounted on metallic heat sinks that are electrically insulated from each other by a thin sheet of electrical insulating material. The diode chips, after being secured to the heat sinks, are covered by a protective insulating coating which preferably takes the form of silicone rubber.

Another object of this invention is to provide an improved electrical connecting arrangement for connecting the phase windings of the alternating current generator to pairs of semiconductor diodes of the bridge rectifier. The connecting arrangement of this invention comprises a plurality of insulator members which have dovetail-shaped portions which are received in complementary dovetail-shaped slots formed in one of the metallic heat sinks of the bridge rectifier. Each insulator carries a multi-arm electrical connector which has been insert molded to the insulator. A pair of arms of each connector is respectively soldered to the faces of a pair of semiconductor diode chips. Each electrical connector has a portion that is adapted to be connected to a phase winding of the alternating current generator.

A further object of this invention is to provide a bridge rectifier that is simple to assemble. Thus, in one embodiment of this invention the two metallic heat sinks of the bridge rectifier and an insulator that is sandwiched between the heat sinks are held together by pins that are formed of insulating material. The pins extend through openings in the heat sinks and insulator and one end of the pins is engaged by a spring steel fastener or clip that also engages one of the heat sinks. The pins have heads which engage the other heat sink. The bridge rectifier is assembled by holding the parts together and applying the spring steel clips or fasteners to one end of the pins.

Another object of this invention is to provide a bridge rectifier for a diode-rectified alternating current generator which is comprised of a pair of metallic heat sinks, one of which engages the metallic end frame of the generator and the other of which has a finned area which is subjected to cooling air when the bridge rectifier is mounted in the generator. The metallic heat sink, that engages the end frame, is formed of copper and the heat sink that is subjected to cooling air is formed of aluminum. Each metallic heat sink supports a plurality of semiconductor diode chips which are adapted to be electrically connected to the phase windings of the alternating current generator.

IN THE DRAWINGS

FIG. 11 is another end view of the bridge rectifier illustrated in FIG. 9 looking in the direction of arrows 11—11 of FIG. 9;

FIG. 12 is another view of the bridge rectifier illustrated in FIG. 9 looking in the direction of arrows 12—12 of FIG. 9;

FIG. 13 is a schematic circuit diagram of the bridge rectifier illustrated in FIG. 9;

FIG. 14 is a plan view of an insulator utilized in the bridge rectifier of FIG. 9;

FIG. 15 is a plan view of a heat sink that is utilized in the bridge rectifier of FIG. 9;

Figure 1:
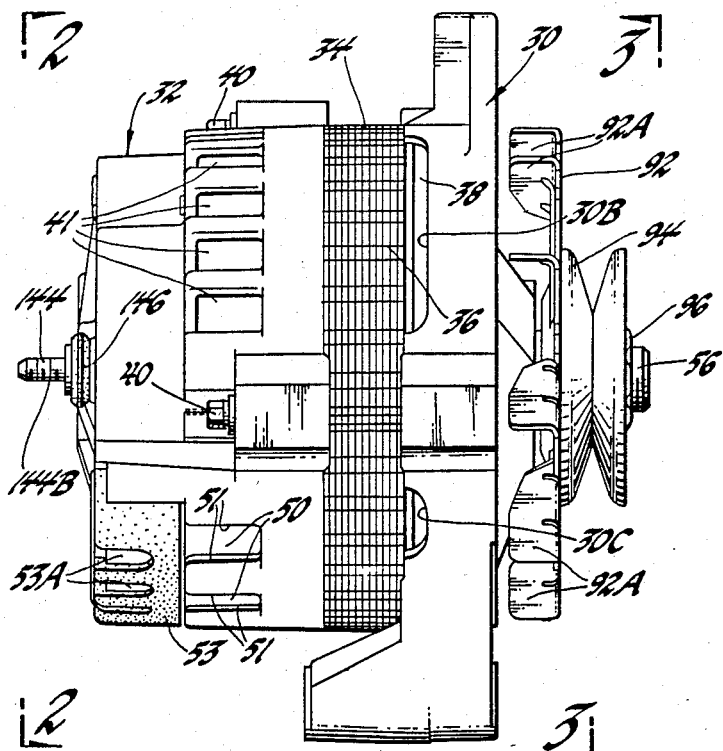
FIG. 1 is an exterior side view of a diode-rectified alternating current generator.
Figure 4:
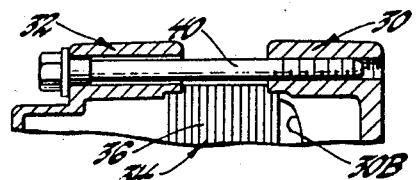
FIG. 4 is a sectional view taken along lines 4—4 of FIG. 2.

Referring now to the drawings and more particularly to FIG. 1, the diode-rectified alternating current generator of this invention comprises a drive end frame 30 and a slip ring end frame 32 both of which are formed of die cast aluminum material. The alternator has a stator assembly generally designated by reference numeral 34 that is comprised of a stator core 36 formed of a plurality of steel stator laminations which are welded together and which have slots that contain a three phase Delta-connected stator winding 38. The laminated core 36 is clamped between inner end surfaces of the end frames 30 and 32 which are secured together by through bolts 40. The bolts 40 extend through openings in end frame 32 and are threaded into threaded openings formed in the end frame 30, as illustrated in FIG. 4.

The slip ring end frame 32 has eight air passages, each designated by reference numeral 41. In addition, the end frame 32 has four rectangular inlet air passages 42 and air inlet passages 44, 46 and 48. The end frame 32 further has three openings or slots 50, which are defined by axially extending walls 51. The slots 50 are aligned with additional slots or passages defined by ribs 50A (FIG. 6) that extend axially of walls 51. The end frame 32 carries a cover member 53 that is formed of plastic material and which is secured to end frame 32 by rivets. The cover 53 has four recesses or slots 53A which form inlet air passages communicating with the passages or slots defined by ribs 50A. The cover 53 is not secured to end frame 32 until after the end leads of stator winding 38 have been connected to connectors of a bridge rectifier, to be described hereinafter. Thus, internal portions of end frame 32 that are eventually covered by cover 53 are accessible from the outside of end frame 32 to make the electrical connections between stator winding 38 and connectors of the bridge rectifier before the cover is attached to the end frame.

The drive end frame 30 has three air outlet passages, each designated as 30A. The drive end frame 30 also has a pair of arcuately extending diametrically opposed air inlet passages 30B that are formed by grooves or slots formed in end frame 30. The surfaces of these grooves or slots are spaced from an end of stator core 36 and these slots extend circumferentially for about 65°. The end frame 30 has another air inlet passage 30C which is formed by an arcuately extending groove or slot formed in end frame 30, the surface of which is spaced from an end of core 36. This slot extends circumferentially for about 20°. The air inlet passages 30B and 30C are aligned with portions of stator winding 38 located to the right of stator core 36, as viewed in FIG. 5.

Figure 5:
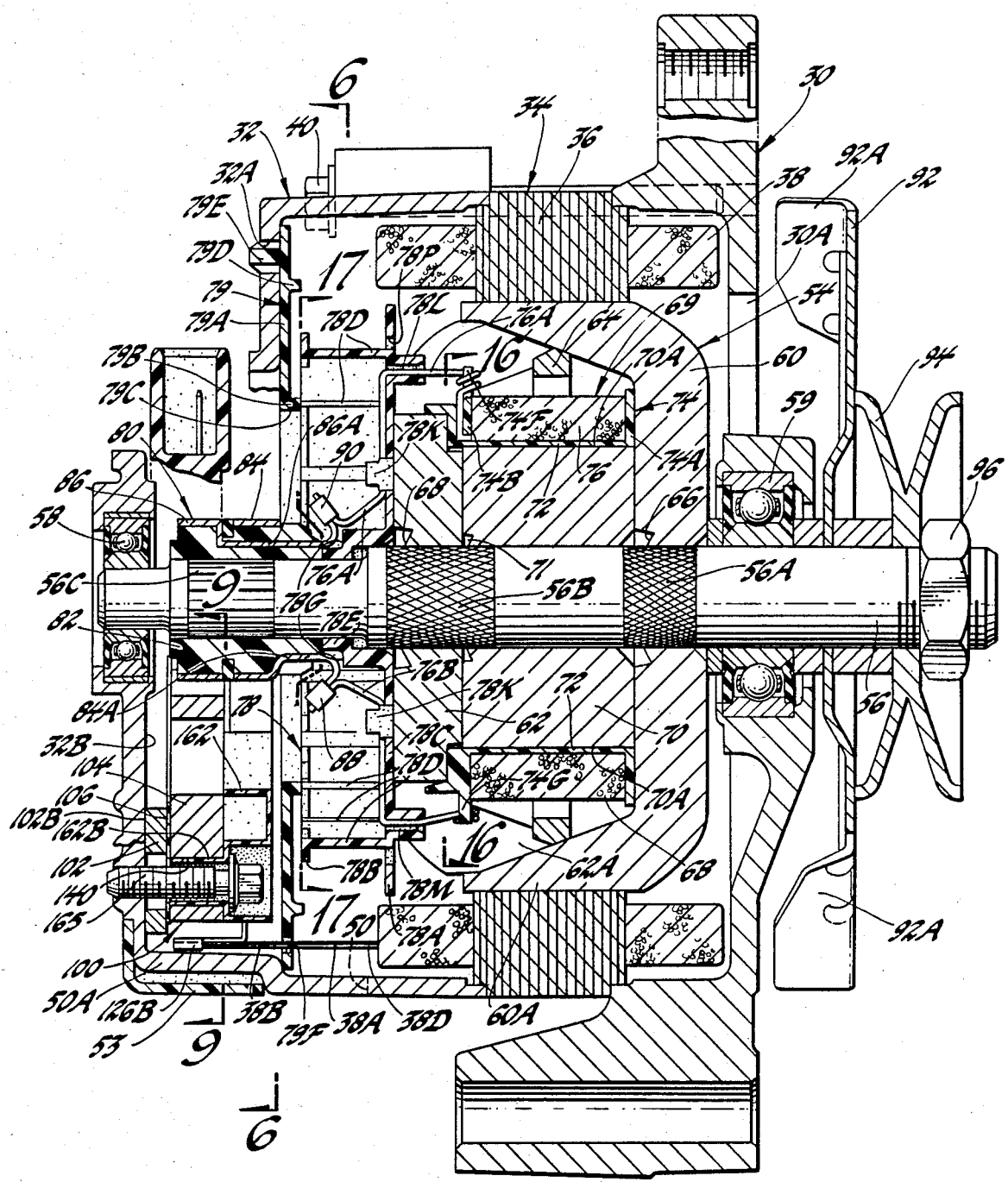
FIG. 5 is a sectional view of the alternator looking in the direction of arrows 5—5 of FIG. 2.

The alternator, as best illustrated in FIG. 5, has a rotor assembly which is generally designated by reference numeral 54. This rotor assembly comprises a shaft 56 which is journaled for rotation in ball bearings 58 and 59. The shaft 56 has helix-diamond knurled portions 56A and 56B and a straight knurled portion 56C. The rotor 54 has a pair of segments or pole members 60 and 62 which are formed of a magnetic material such as steel and which respectively have axially extending pole teeth 60A and 62A. The pole teeth of the two segments are interleaved, that is the pole teeth of one segment are located in the gaps between the pole teeth of the other segment. The inner surfaces of the pole teeth are engaged by an aluminum ring 64. The segments 60 and 62 have central openings that receive the shaft 56 and the segments are secured to the shaft 56 by circular staking portions of the segments into the knurled portions of the shaft as indicated by reference numerals 66 and 68.

Figure 16:
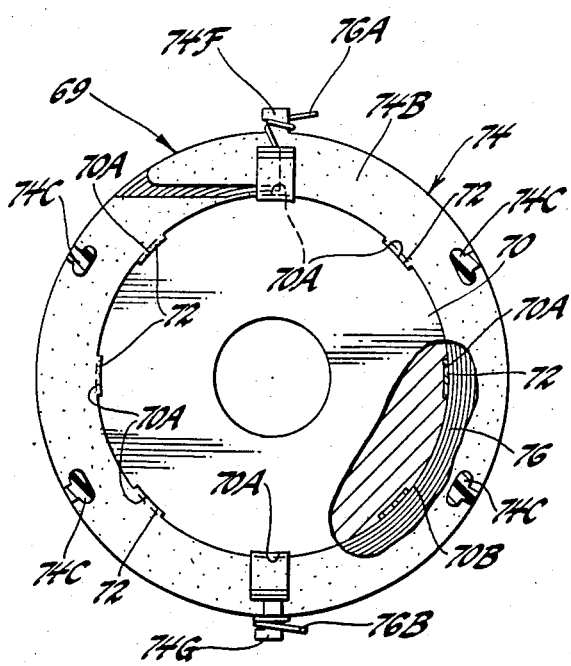
FIG. 16 is a view of a rotor core and field coil assembly looking in the direction of arrows 16—16 of FIG. 5.
Figure 18:
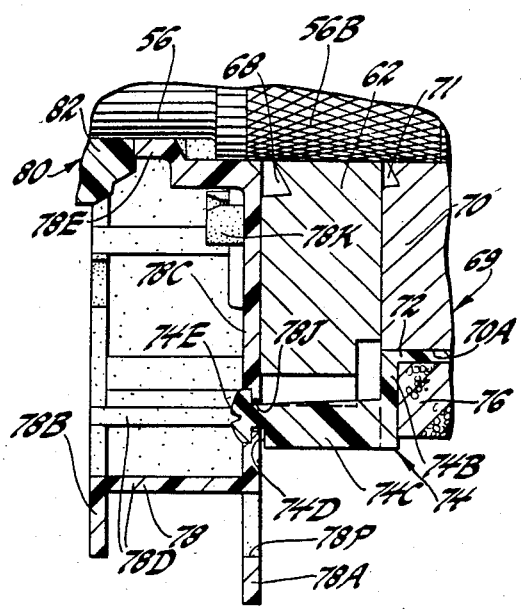
FIG. 18 is a sectional view taken along lines 18—18 of FIG. 17.

The rotor 54 has a core and field coil assembly generally designated by reference numeral 69 which is illustrated in FIGS. 5 and 16. This assembly includes a cylindrical core member 70 which is formed of a magnetic material such as steel and which has a central bore that receives shaft 56. The core 70 is secured to shaft 56 by circular staking portion 71 thereof into engagement with knurled portion 56B. The core member 70 (FIG. 16) has eight axially extending circumferentially spaced slots 70A formed at the exterior thereof which extend the entire length of the core member 70. The slots 70A receive axially extending circumferentially spaced ribs 72 of a spool 74 that is formed of electrical insulating material. The ribs 72 extend between and are joined to end flanges 74A and 74B of spool 74. A field coil 76, formed of a number of turns of insulated copper wire, is wound in the area between flanges 74A and 74B. The inner turns of the field coil 76 directly engage the outer surfaces of ribs 72 and also directly engage outer arcuate surfaces 70B of the metallic core 70 located between ribs 72. The outer surface of the core 70, with the exception of the end faces thereof, is coated with a paint that forms a coating of electrical insulating material.

Figure 17:
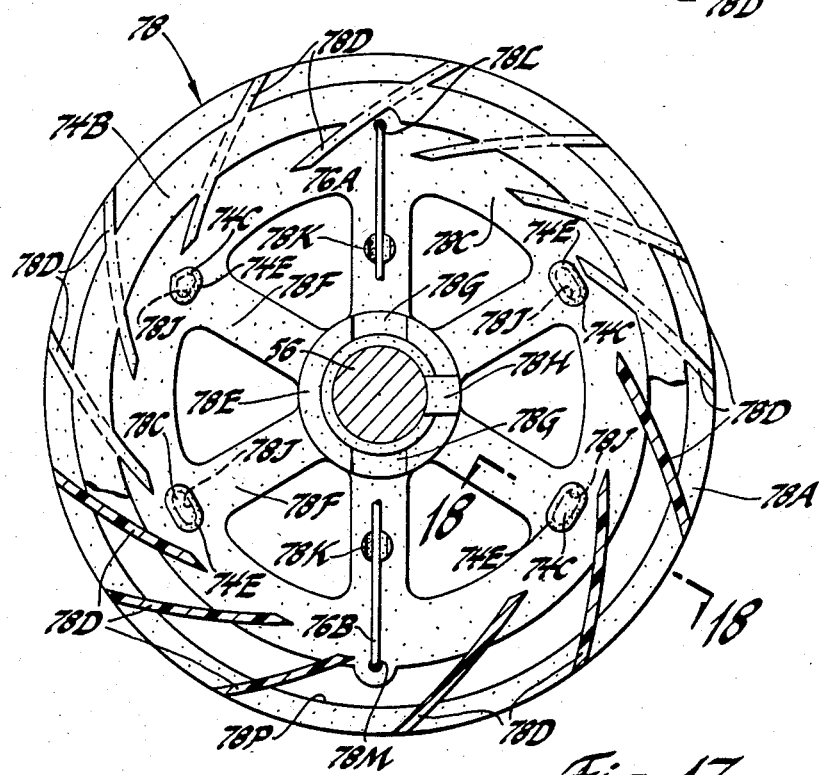
FIG. 17 is an end view of a fan that forms a part of the rotor assembly of the alternator of this invention looking in the direction of arrows 17—17 of FIG. 5.

The rotor 54 has a cooling fan (FIG. 17) which is generally designated by reference numeral 78. The cooling fan 78 is formed of plastic material and may be, for example, a one-piece plastic molding formed of nylon. The fan 78 has a pair of axially spaced annular portions 78A and 78B and an annular portion 78C all of which are joined by axially extending fan blades 78D. The fan 78 has a hub portion 78E which is connected to portion 78C by spokes 78F. The portion 78C of the fan 78 has four circumferentially spaced holes 78J which respectively receive the ends of four circumferentially spaced posts 74C which are integral parts of the spool 74 and which extend axially from the annular flange 74B of the spool 74. The posts 74C have surfaces 74D which engage one surface of fan portion 78C and have end portions which extend through the openings in the portion 78C of the fan 78. These end portions are headed or wedged over against an inner surface of the portion 78C as indicated by reference designation 74E by ultrasonic welding apparatus. It can be seen from the foregoing that the posts 74C serve to axially retain the fan against pole member 62. The posts 74C extend through the gaps located between the pole teeth 62A of the segment 62.

The rotor assembly 54 has a slip ring assembly generally designated by reference numeral 80. This slip ring assembly comprises a bored annular insulator 82 which is secured to the shaft 56 by forcing the insulator 82 over the straight knurled portion 56C. The insulator 82 carries annular copper slip rings 84 and 86. The slip rings are molded to the insulator 82 and each slip ring has an integral connector 84A and 86A, the ends of which are positioned respectively in metallic clips 88 and 90. The metallic clips also receive the end leads 76A and 76B of the field coil 76. The metallic clips 88 and 90 are crimped to the conductors of the slip ring and the end leads of the field coil and are then welded thereto. The end leads 76A and 76B are fitted into conductor retaining lugs 78K formed integral with the fan 78. The end leads 76A and 76B are wound around posts 74F and 74G of spool 74 and extend respectively through holes 78L and 78M formed in axially extending cylindrical portions of fan 78.

When assembling the rotor 54 the hub portion 78E of fan 78 is press-fitted to the shaft 56 and the fan is moved into engagement with pole member 62. As the fan 78 is assembled to the shaft the ends of the posts 74C pass through the openings 78J in the fan and the ends of these posts are then headed over, as has been explained. When the slip ring assembly 80 is assembled to the shaft it is moved into engagement with the end of fan hub portion 78E and the fan lug 78H moves into a radially extending slot (not illustrated) formed in slip ring insulator 82. The slots 78G in the fan hub 78E receive the slip ring connectors 84A and 86A.

After the rotor has been assembled, as has been described, it is dipped in varnish to impregnate the rotor in a manner well known to those skilled in the art. The varnish, due to wicking, flows to some extent between portions of the fan 78 and segment 62 and when the varnish has dried it bonds the fan to the segment. The fan 78 is nonrotatably secured to shaft 56 by the just described varnish bonding, by the lug 78H which fits in the slot in the insulator 82, by the press-fit of the fan hub 78E with shaft 56 and to some extent by posts 74C that connect the field coil spool and fan.

The fan 78 has a circumferentially extending slot or gap 78P located between fan portions 78A and 78C. When the fan is assembled to the rotor this gap 78P is outboard of the unbroken portion of rotor pole member 62 and is aligned with the gaps between the pole teeth 62A. The gap 78P permits some axial flow of cooling air therethrough.

The fan 78 cooperates with a fan baffle 79 which is formed of a plastic material such as glass filled nylon. The baffle has an annular portion 79A and has an annular flange 79B defining a central circular opening 79C. The baffle has another annular flange 79D. The baffle 79 is secured to end frame 32 by a plurality of groups of resilient integral teeth 79E that are press-fitted into a plurality of holes 32A formed in end frame 32.

The shaft 56 carries a steel cooling fan designated by reference numeral 92 which has a plurality of fan blades 92A and also carries a drive pulley designated by reference numeral 94. The pulley and fan are secured to the shaft 56 by a nut 96 threaded onto a threaded end of shaft 56.

End frame 32 contains a bridge rectifier assembly which is generally designated by reference numeral 100 and which is illustrated in detail in FIGS. 9, 10, 11 and 12. The bridge rectifier assembly 100 comprises a copper heat sink 102, an aluminum heat sink 104 and a thin insulator 106 that is disposed between the heat sinks 102 and 104. The insulator 106 is about 0.22 mm thick and is formed of a glass fiber woven mat core that is covered or encapsulated by an uncured elastomeric material such as an uncured silicone rubber. The insulator 106 is sandwiched between heat sinks 102 and 104 and is baked to a temperature sufficient to cause the silicone rubber to cure and adhere to surfaces of the heat sinks 102 and 104 to thereby adhesively bond these parts together. The heat sink 104 has an arcuately extending portion 104A that is not overlapped by copper heat sink 102. Portion 104A has a plurality of radially extending ribs or fins 104B that define radially extending passages 104C.

Figure 19:
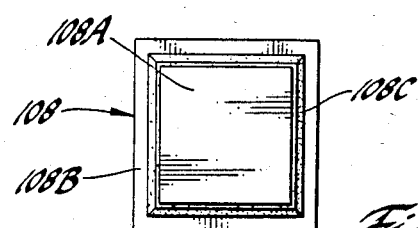
FIGS. 19 and 20 are respectively plan and side views of a diode assembly utilized in the bridge rectifier of FIG. 9.
Figure 20:
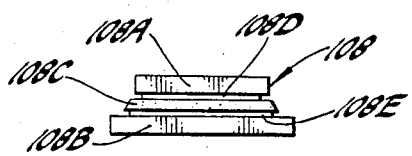
Figure 21:
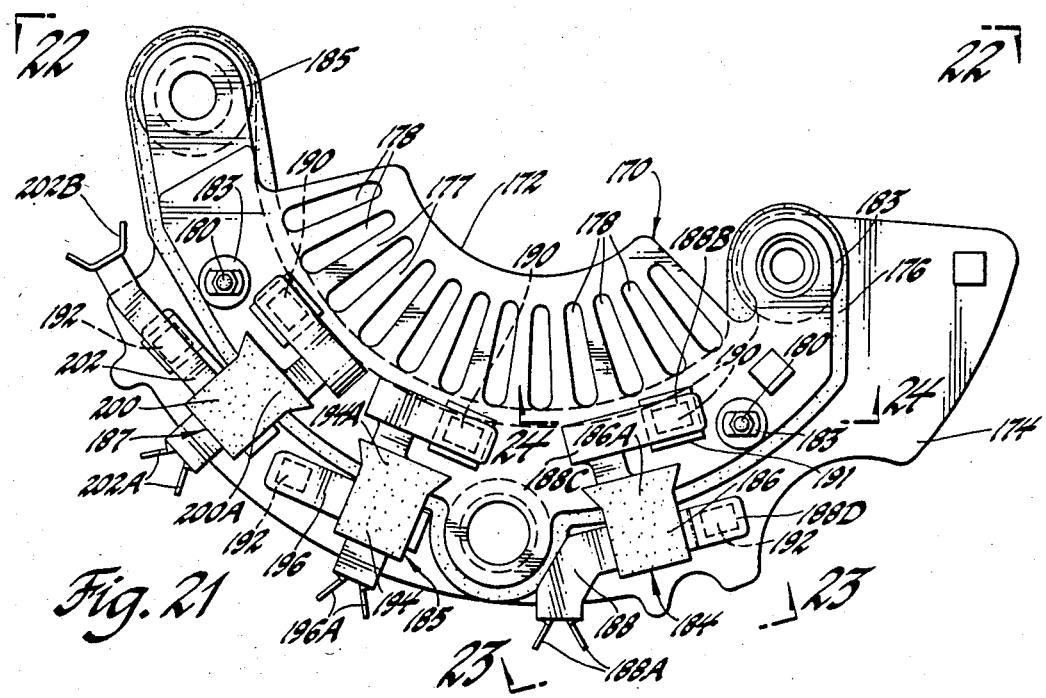
FIG. 21 is a plan view of a modified bridge rectifier.
Figure 22:
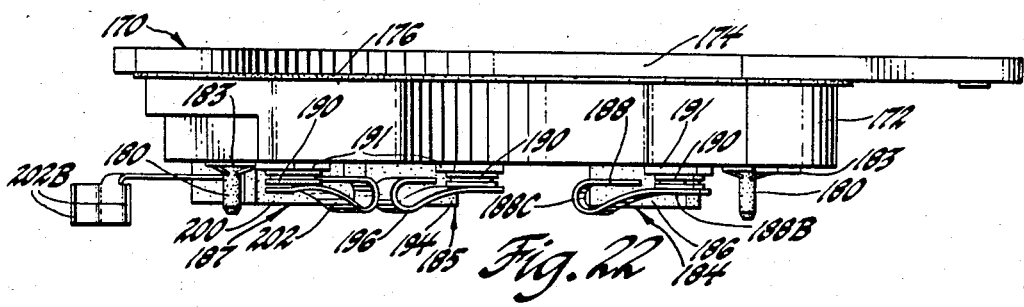
FIG. 22 is an end view of the bridge rectifier illustrated in FIG. 21 looking in the direction of arrows 22—22 of FIG. 21.

The heat sink 102 has a surface 102A that is not overlapped by heat sink 104 which carries three diodes, each designated by reference numeral 108. The diodes 108 are semiconductor diodes and the diodes are arranged such that the anodes of the diodes 108 are all electrically connected to the heat sink 102. This is depicted in FIG. 13 which is a schematic circuit diagram of bridge rectifier 100. Each diode 108, as is depicted in FIGS. 19 and 20, comprises metallic contact members 108A and 108B which are formed of nickel plated copper, a semiconductor rectifier or diode chip 108C and solder preforms 108D and 108E that serve to solder the contact members to opposite faces of a diode chip. Contact 108B is slightly larger in external dimension than contact 108A. In the diode assembly, in FIGS. 19 and 20, the PN junction of the diode chip 108C is poled such that its anode is electrically connected to the contact 108A. Each contact 108A is soldered directly to face 102A of the copper heat sink 102. The semiconductor diode chips 108C have a coating of glass passivation material around their outer marginal edge.

A surface 104D of heat sink 104 carries three additional diodes, each designated by reference numeral 110. The cathodes of these diodes are all electrically connected to the heat sink 104, as is depicted in the schematic circuit diagram of FIG. 13. The diodes 110 are the same as the diodes 108, illustrated in FIGS. 19 and 20. The larger contact of each diode 110, like contact 108B of diode 108 are respectively soldered to copper pads 109 which are ultrasonically welded to surface 104D of the aluminum heat sink 104.

Figure 10:
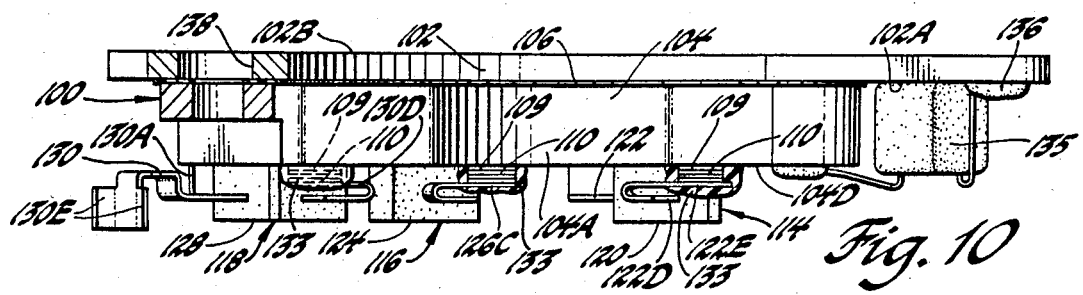
FIG. 10 is an end view of the bridge rectifier illustrated in FIG. 9 looking in the direction of arrows 10—10 of FIG. 9.

The heat sink 104 carries three terminal assemblies designated respectively by reference numerals 114, 116 and 118. Each terminal assembly comprises an insulator member to which is insert molded an electrical connector formed of copper material. Thus, terminal assembly 114 is comprised of an insulator block or member 120 to which has been insert molded an electrical connector 122. The terminal assembly 116, in a similar fashion, comprises insulator block 124 that carries electrical connector 126 and terminal assembly 118 comprises an insulator block 128 that carries an electrical connector 130. The heat sink 104 has dovetail or wedge-shaped slots 130, 132 and 134 which respectively receive dovetail-shaped portions 120A, 124A and 128A of the insulators. The dovetail-shaped portions are press-fitted into the dovetail-shaped slots and are coated with a suitable adhesive so as to bond the insulators to the heat sink 104. Portions of the heat sink 104 adjacent the slots may be staked into engagement with the insulator blocks as will be described hereinafter in connection with the bridge rectifier illustrated in FIG. 23. Each of the electrical connectors have multiple arms. Thus, connector 122 has a portion 122A and a downwardly extending portion 122B which terminates in a portion having crimping wings 122C. The wings 122C are adapted to be crimped into engagement with end leads of a pair of phase windings of the three phase winding 38. The connector 122 has a reversely bent portion 122D and a portion 122E, which is soldered to one face of a contact of diode 110 as is best illustrated in FIG. 10. The connector 122 further has a portion 122F which is located near a slanted surface 120A of insulator 120 and has a portion 122G which is soldered to one face of the contact of diode 108.

The connector 126 has a portion 126A which terminates in a portion having crimping wings 126B that are adapted to be crimped to conductors connected with phase windings of the winding 38. The connector 126 has a portion 126C that is soldered to an end of diode 110 and a portion 126D electrically connected to one end of a diode 108.

The connector 130 has a portion 130A which terminates in a portion that has crimping wings 130B which are adapted to be crimped against phase winding leads. The connector 130 has a portion 130C connected to one side of diode 108 and a portion 130D connected to one side of diode 110. The connector 130 further has a portion formed with ears 130E that forms an electrical terminal connection to a pair of the phase windings of the generator and between a pair of diodes of the bridge rectifier. The schematic circuit diagram of FIG. 13 illustrates the respective electrical connectors 122, 126 and 130 and other portions of the electrical connectors.

The diodes 108 and 110 are each covered or encapsulated by a protective coating of electrical insulating material which covers the diode and also engages and adheres to portions of the heat sinks 102 and 104 immediately adjacent the diodes. These protective coatings have all been designated by reference numeral 133 and it can be seen, from the drawings, that each coating 133 is adhered to an area of a surface of a heat sink immediately adjacent the outer periphery of a diode and also completely encapsulates an end portion of an electrical connector arm that is soldered to a contact of a diode. The coating material for coatings 133 may be an uncured silicone rubber which is applied to each diode and around the end of an electrical connector. After being applied to the diodes and the ends of the electrical connector arms the temperature of the silicone rubber coating is raised to a point that is sufficient to cause the silicone rubber to cure. When cured, it adheres to the exposed portions of each diode, to the heat sink surfaces immediately adjacent the outer periphery of a diode and to the portions of the electrical connector arms that are soldered to a face of a contact of a diode. The protective coating entirely encapsulates a diode and serves to protect the diodes from adverse materials that they are subjected to during use on a motor vehicle such as salt spray.

Figure 9:
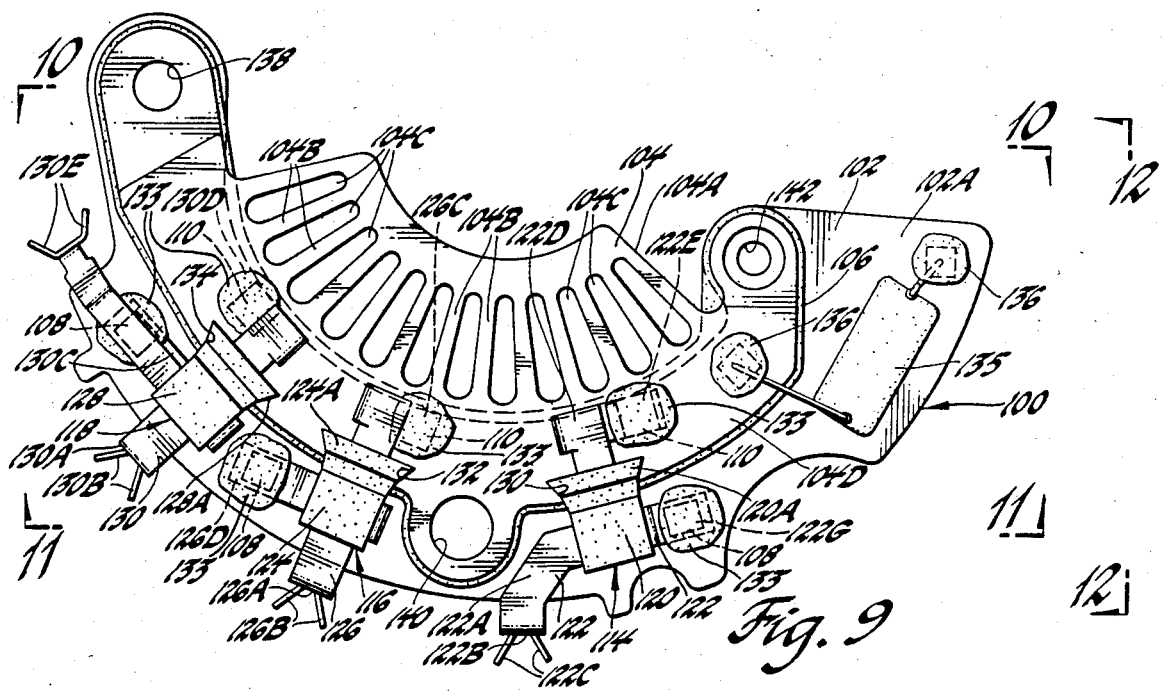
FIG. 9 is a plan view of a bridge rectifier looking in the direction of arrows 9—9 of FIG. 5.

The bridge rectifier 100 has a capacitor 135, the opposite ends of which are electrically connected to heat sink 102 and heat sink 104 as illustrated in FIG. 9. The electrical connections of the capacitor to the respective heat sinks is also covered with a protective coating designated by reference numeral 136.

Figure 7:
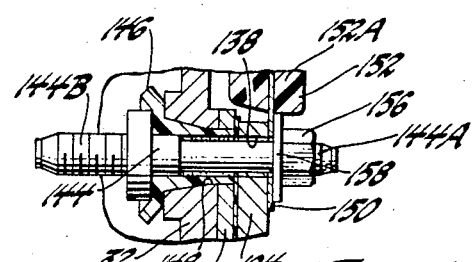
FIG. 7 is a sectional view taken along lines 7—7 of FIG. 6.

The mounting of the bridge rectifier 100, within end frame 32 and its electrical connection with the phase windings of the three phase winding 38, will now be described. As best illustrated in FIG. 5, the bridge rectifier 100 is mounted within the end frame 32 such that the flat surface 102B of copper heat sink 102 directly engages and lies flat against an inner flat surface 32B of the end frame 32. A thin layer of a zinc oxide loaded grease (not illustrated) is compressed between surfaces 102B and 32B when bridge rectifier 100 is secured to end frame 32. The grease is applied prior to the securing of the bridge rectifier 100 to end frame 32 and the purpose of this grease is to provide a good heat transfer path between heat sink 102 and end frame 32. About 80% of surface 102B will be in direct metal-to-metal contact with surface 32B and the grease fills any voids in the surfaces to ensure a good heat conductive path between areas of the surfaces that may have small voids. This grease is an electrical insulator. The bridge rectifier 100 is secured to the end frame 32 by two screws and a terminal stud which respectively extend through openings 138, 140 and 142 of the bridge rectifier. These openings are formed by aligned openings in the heat sinks 102 and 104 and the insulator 106. One of the fasteners for securing the bridge rectifier to the frame 32 is a terminal stud designated by reference numeral 144 which is best illustrated in FIG. 7. The stud 144 also forms a positive direct voltage output terminal for the diode-rectified alternating current generator. The stud 144 passes through an electrical insulator 146, a portion of which is disposed within a hole 148 formed in an end wall of frame 32. The stud 144 extends through the opening 138 of the bridge rectifier 100 and also extends through a hole in a metallic terminal portion 150 of a semiconductor generator voltage regulator 152 having a molded plastic housing 152A. The stud 144 has a threaded portion 144A that receives a nut 156 which is threaded onto the threaded portion. The nut 156 has an integral flange 158 that abuts voltage regulator terminal 150. The stud 144 further has a threaded portion 144B which forms the positive direct voltage output terminal for the diode-rectified alternating current generator. It will be evident from the foregoing that the stud or screw 144 is electrically insulated from the end frame 32 and the heat sink 102 but is electrically connected to the heat sink 104 and the metallic terminal 150 of the voltage regulator 152. The stud 144 is therefore electrically connected to the cathodes of diodes 110 and is at the positive direct voltage output of the bridge rectifier.

Figure 8:
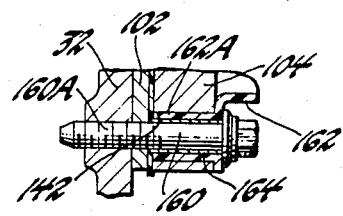
FIG. 8 is a sectional view taken along lines 8—8 of FIG. 6.

The bridge rectifier 100 is further secured to end frame 32 by a metallic screw 160 that passes through the hole 142 in the bridge rectifier. The screw 160 has a threaded portion 160A which is threaded into a threaded opening formed in end frame 32. The screw 160 passes through a tubular portion 162A of a cover member 162 that is formed of a plastic material. The tubular portion 162A of the cover member contains a metallic tubular spacer 164 which is disposed about the screw 160. One end of spacer 164 engages the head of this screw and the other end of spacer 164 engages heat sink 102. The purpose of the spacer 164 is to ensure a good electrical connection between heat sink 102 and end frame 32 via screw 160 and spacer 164. Thus, in the event that the layer of grease between heat sink 102 and end frame 32 should completely electrically insulate these parts, which is very unlikely, the metallic spacer 164 would serve to electrically connect end frame 32 and heat sink 102 via screw 160. It will be evident, from an inspection of FIG. 8, that the screw 160 is electrically insulated from the heat sink 104 but is electrically connected to frame 32 and heat sink 102 via screw 160.

The bridge rectifier 100 is additionally secured to frame 32 by a screw 165 which is threaded into a threaded hole in the frame 32. The screw 165 passes through the opening 140 in the bridge rectifier 100 and also passes through another tubular portion 162B of plastic cover 162.

The voltage regulator 152 is secured to end frame 32 by stud 144, as shown in FIG. 7, and as previously described. The voltage regulator is also fixed to end frame 32 by a screw 167. The screw 167 further serves to secure a brush holder 168, formed of plastic material, to end frame 32. The brush holder 168 slidably supports a pair of brushes (not illustrated) that engage slip rings 84 and 86. One of the brushes is electrically connected to an apertured U-shaped connector 168A which embraces a portion of brush holder 168. One side of this connector engages an apertured metallic terminal 152B of voltage regulator 152. The screw 167 passes through the aligned holes or apertures in connector 168A, in a portion of brush holder 168 and in voltage regulator terminal 152B and is threaded into a threaded opening in end frame 32. The other brush is connected to a connector 168B which in turn is connected to an L-shaped voltage regulator terminal 152C. The voltage regulator 152 has another L-shaped terminal 152D and crimping wings 130E of bridge rectifier 100 are crimped and then soldered to regulator terminal 152D.

Figure 6:
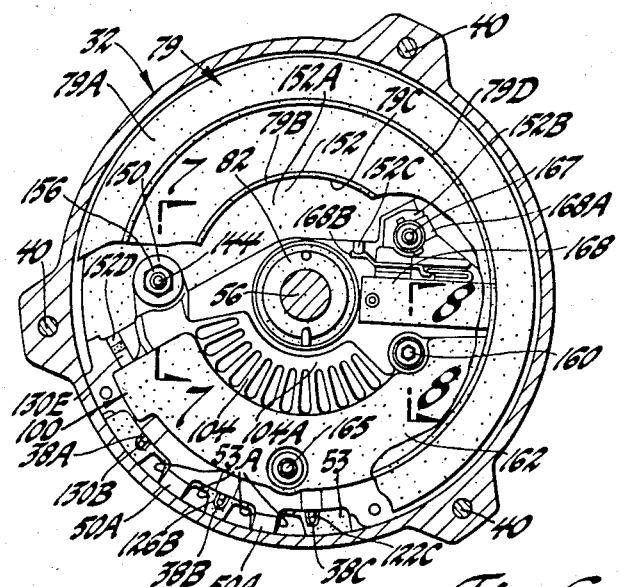
FIG. 6 is an internal view partly in section and with parts broken away of the slip ring end frame of the alternator illustrated in FIG. 5 looking in the direction of arrows 6—6 of FIG. 5.

The electrical connections between the phase windings of the output winding 38 and the AC input terminals of the bridge rectifier are illustrated in FIGS. 5 and 6. As previously mentioned, the three phase stator winding 38 is Delta-connected. The end leads of pairs of phase windings are illustrated in FIG. 6 and the pairs of leads are identified by reference numerals 38A, 38B and 38C. Lead pair 38B is also illustrated in FIG. 5 and, as shown, the leads 38A are twisted together as at 38D and then extend side by side into crimping wings 126B of bridge rectifier 100. The other lead pairs are also twisted and extend side by side like lead pair 38B. The crimping wings 122C, 126B and 130B of the respective electrical connectors of bridge rectifier 100 are shown, in FIG. 6, crimped into engagement with the lead pairs of the phase windings and these leads or conductors are soldered to the connectors after being crimped thereto. The lead pairs 38A, 38B and 38C extend through holes formed in baffle 79, one of which is illustrated in FIG. 5 and designated as 79F.

A modified bridge rectifier, which can be substituted for the bridge rectifier 100 and which can be fixed to the end frame 32 in the same manner as has been described in connection with bridge rectifier 100, is illustrated in FIGS. 21–25. This bridge rectifier has been generally designated by reference numeral 170 and it comprises an aluminum heat sink 172, a copper heat sink 174 and an insulator 176 interposed and sandwiched between the two heat sinks. An annular washer 183, formed of insulating material, is sandwiched between heat sink 172 and a portion of insulator 176. In a similar fashion an annular washer 185, formed of insulating material, is sandwiched between heat sink 172 and insulator 176. The insulator 176 is formed of a woven glass fiber mat that is covered by cured silicone rubber. The thickness of insulator 176 is about 0.22 mm. The heat sinks 174 and 172 and the insulator 176 are generally of the same shape as the corresponding parts of bridge rectifier 100. The heat sink 172 has a plurality of ribs 177 and air passages 178 which perform the same function as the ribs 104B and the passages 104C of heat sink 104. The bridge rectifier 170 does not rely on adhesive bonding of the insulator 176 to the heat sinks to secure the heat sinks together. The heat sinks and the insulator are held fixed together by two pin-type fasteners 180 which are formed of a plastic electrical insulating material such as a glass reinforced nylon. Each fastener or pin 180 extends through aligned holes 182 and 184 formed respectively in the heat sink 172 and the insulator 176. Each pin 180 has ribs 180A which extend partially into hole 182. The heat sink 174 has a chamfered opening 174A which receives and engages a chamfered head 180B of the fastener 180. The fastener 180 extends through two resilient ears 183A of a spring steel clip or fastener 183 that extend from a circular base portion of fastener 183. The base of retaining clip 183, prior to being secured to pin 180, is slightly bowed. In assembling the heat sink 172, the insulator 176 and the heat sink 174, a fastener 180 is inserted through the aligned openings in these parts such that chamfered portion 180B engages chamfered surface 174A. The ribs 180A are crushed when they enter the hole 182 and they have a press-fit with the hole 182 to maintain the parts assembled. With the parts supported from movement the clips 183 are pressed onto pins 180. During this operation the base of clip 183 is flattened when it is forced against a surface of heat sink 172 and when this force is terminated the resilient ears 183A bite into the pin 180 to secure the clip 183 to the pin 180.

The bridge rectifier 170 has three terminal assemblies designated respectively by reference numerals 184, 185 and 187 which perform the same function as the terminal assemblies 114, 116 and 118 of the bridge rectifier 100. The terminal assembly 184 comprises a block of insulating material 186 to which has been insert molded a copper electrical connector 188. The copper electrical connector includes a portion having crimping wings 188A which are crimped into engagement with the phase leads of a pair of phase windings. The connector 188 has a portion 188B extending from a reversely bent portion 188C. The portion 188B is electrically connected to one side of a diode 190, the opposite side of diode 190 being soldered to a copper pad 191 that is welded to a surface of the heat sink 172. The connector 188 further has a portion 188D which is electrically connected to one side of a diode 192. The opposite side of diode 192 is electrically connected and supported by a surface of heat sink 174.

The heat sink 172 carries two other diodes 190 and the heat sink 174 carries two other diodes 192. The diodes 190 correspond to the diodes 110 of bridge rectifier 100 and the diodes 192 correspond to the diodes 108 of bridge rectifier 100. All of these diodes take the same form as illustrated in FIGS. 19 and 20 and are electrically connected to the respective heat sinks and arms of the electrical connectors in the same manner as has been described in connection with bridge rectifier 100. Further, these diodes are all covered by an insulating material (not illustrated) like material 133 of bridge rectifier 100.

The terminal assembly 185 comprises a block of insulating material 194 which carries an electrical connector 196 that is insert molded to insulator 194. The electrical connector 196 has crimping wings 196A for connection to the phase leads of a pair of phase windings. The connector 196 is respectively connected to one side of diodes 190 and 192.

The terminal assembly 187 comprises a block of insulating material 200 which carries an electrical connector 202. This connector is insert molded to the insulator member 200 and has crimping wings 202A that are adapted to be electrically connected to the phase leads of a pair of phase windings. The connector 202 has crimping wings 202B which perform the same function as the wings 130E of the bridge rectifier 100.

Figure 23:
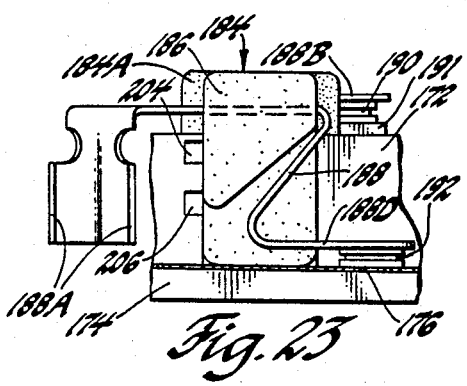
FIG. 23 is a view of the bridge rectifier illustrated in FIG. 21 looking in the direction of arrows 23—23 of FIG. 21.
Figure 24:
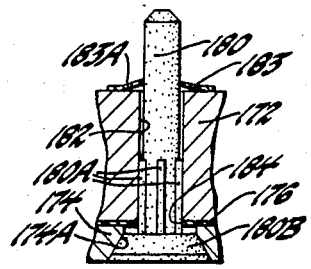
FIG. 24 is a sectional view taken along lines 24—24 of FIG. 21.

The insulator members 186, 194 and 200 have wedge or dovetail-shaped portions 186A, 194A and 200A which are received in wedge or dovetail-shaped slots formed in heat sink 172. In order to secure the insulator members to the heat sink 172 the heat sink is staked into engagement with an insulator member to retain an insulator member in a respective slot. FIG. 23 illustrates staked areas 204 and 206 where material of the aluminum heat sink 172 have been staked into engagement with insulator member 186. The two other insulator members 194 and 200 are fixed to the heat sink 172 in the same manner.

Figure 25:
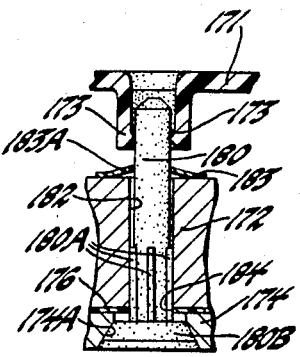
FIG. 25 is a sectional view illustrating how a cover member is attached to the modified bridge rectifier shown in FIG. 21.

The cover member for covering the modified bridge rectifier 170 is formed of plastic material, is designated by reference numeral 171 and is partially illustrated in FIG. 25. The cover member 171 is the same as cover member 162 for bridge rectifier 100 but has integral means for attaching it to the bridge rectifier. Thus, the cover member 171 for bridge rectifier 170 has two pairs of integral resilient ears 173 that can be pushed onto the end portions of pins 180 that protrude beyond a surface of heat sink 172 for securing the cover member 171 to bridge rectifier 170, as illustrated in FIG. 25.

The heat transfer characteristics of the bridge rectifiers of this invention, for conducting heat away from the diodes of the bridge rectifiers, will now be discussed with reference to bridge rectifier 100. The heat generated in diodes 108 is conducted to copper heat sink 102 and respectively to connectors 122, 126 and 130. Since the heat sink surface 102B is mounted flat against surface 32B of aluminum end frame 32 there is a good heat conductive path to end frame 32 through copper heat sink 102 and the layer of grease disposed between heat sink 102 and end frame 32. As a result, the end frame 32 operates as a good heat dissipator since it has substantial size and mass. In addition, the area of surface 102B of heat sink 102, which contacts end frame 32, is made as large as possible to ensure good heat transfer to end frame 32.

The heat generated in diodes 110 is conducted to aluminum heat sink 104 and to copper connectors 122, 126 and 130. The heat sink 104 is thicker than heat sink 102 and has a larger mass. The heat sink 104 will transfer heat to air which is in contact with it and cooling air is forced through passages 104C and into contact with ribs or fins 104B to cool heat sink 104 in a manner which will be more fully described hereinafter. Some of the heat generated in the diodes 110, that are mounted on heat sink 104, will be conducted to end frame 32 through insulator 106 and heat sink 102 when heat sink 104 is hotter than heat sink 102, for example when the generator is driven at low speed with little air cooling of heat sink 104.

Figure 2:
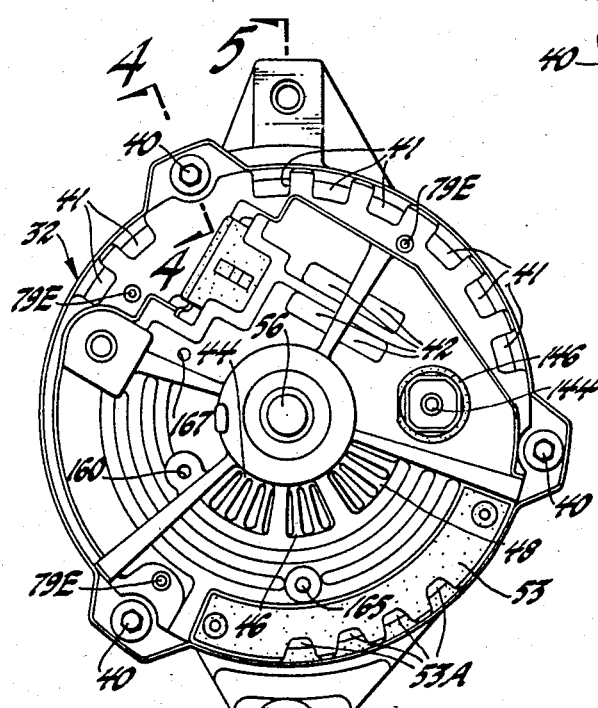
FIG. 2 is an end view of the alternator illustrated in FIG. 1 looking in the direction of arrows 2—2 of FIG. 1.
Figure 3:
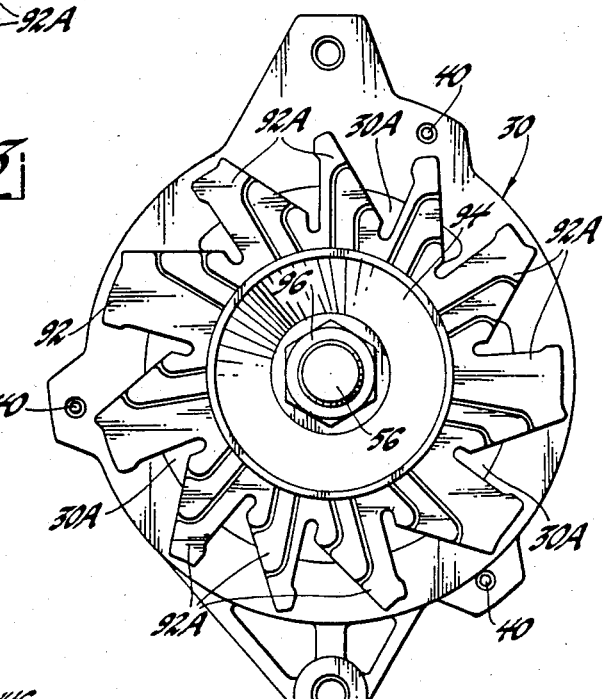
FIG. 3 is an end view of the alternator illustrated in FIG. 1 looking in the direction of arrows 3—3 of FIG. 1.

In addition to the heat transfer path to end frame 32, just described, for dissipating heat from diodes 110, the heat generated in these diodes will be transferred to finned portion 104A of heat sink 104. This is comprised of passages 104C and ribs or fins 104B. This portion of heat sink 104 is not overlapped by heat sink 102, insulator 106 nor cover 162. As seen in FIGS. 5 and 6, this portion 104A of heat sink 104 is aligned with a portion of the central opening 79C in baffle 79 and this portion 104A of heat sink 104 is also aligned with air inlet openings 44, 46 and 48 formed in end frame 32, as depicted in FIG. 2. As a result of the foregoing, air that is pulled into the generator by fans 78 and 94 will flow directly through passages 44, 46 and 48 and then through passages 104C in heat sink 104. This stream of air contacts the ribs or fins 104B and portions of heat sink 104 joined to ribs 104B to air cool heat sink 104.

The modified bridge rectifier 170, which can be used instead of bridge rectifier 100, is mounted to end frame 32 in the same manner as has been described in regard to the mounting of bridge rectifier 100 to end frame 32. The purpose of the washers 183 and 185, of modified bridge rectifier 170, is to prevent the insulator 176 from being crushed to a point where the heat sinks might become shorted when the screws are torqued to secure the bridge rectifier 170 to end frame 32. The washers would not be necessary if the insulator 176 could withstand the force that is applied when the screws are torqued to secure the bridge rectifier to the end frame. The heat transfer paths for the diode chips of bridge rectifier 170 is the same as that described for the diode chips of bridge rectifier 100.

The insulator 176 of bridge rectifier 170 can take forms other than the glass fiber mat cured silicone rubber that has been described. Thus, instead of using a glass cross-woven glass mat for the core the inner portion could be made of Kapton (trademark of E. I. du-Pont de Nemours & Co., Inc.) that is coated with a cured silicone rubber. In addition the washers, like washers 183 and 185, can be provided as washers of Kapton material that are integral with an insulator that has a glass fiber mat core that is coated with silicone rubber that is cured. The Kapton washers would be adhered to the outer skin of the silicone rubber. It is preferred that washers, like washers 183 and 185, only be used where the danger of crushing must be taken into account and in this regard it may only be necessary to use one washer, namely for terminal stud 144.

In the design of the bridge rectifier of this invention the thermal transfer paths between the semiconductor diode chips and the heat sinks is kept as short as possible. Moreover, the insulator between the heat sinks is made of good heat conducting material and is as thin as possible to ensure good heat con- ductivity.

The semiconductor chips that form the diodes of the bridge rectifiers are all preferably of the avalanche silicon type although the principles of this invention apply to semiconductor silicon diode chips that are not of the avalanche type.

The embodiments of the invention in which an exclusive property or privilege is claimed are defined as follows:

1. A bridge rectifier for an alternating current generator comprising, a first metallic heat sink that is adapted to engage an end frame of an alternating current generator when the bridge rectifier is mounted to the generator, a second metallic heat sink, an electrical insulator sandwiched between said heat sinks for electrically insulating said heat sinks from each other, a first group of semiconductor diode chips supported by said first heat sink such that they are electrically connected to and in heat transfer relationship with said first heat sink, a second group of semiconductor diode chips supported by said second heat sink such that they are electrically connected to and in heat transfer relationship with said second heat sink, a plurality of insulator blocks supported by and secured to said second heat sink each carrying an electrical connector having a plurality of arms, each said electrical connector molded to a respective insulator block, each said insulator block having a dovetail-shaped portion that is disposed within a complementary dovetail-shaped slot formed in said second heat sink, said connectors being adapted to be connected to the phase windings of an alternating current generator, a pair of arms of each electrical connector being electrically connected to the respective faces of a pair of semiconductor diode chips where one of the pair of diode chips is a diode chip of said first group of diode chips and the other diode chip of the pair is a diode chip of the second group of diode chips, and a coating of insulating material covering each diode chip, said coating engaging and adhering to a connector arm and surface areas of said heat sinks adjacent each chip to encapsulate a diode chip.

2. A polyphase bridge rectifier adapted to be fixed to the end frame of an alternating current generator comprising, a first arcuately extending metallic heat sink that is adapted to be mounted in direct metal-to-metal contact with a surface of a metallic end frame of said generator, a second metallic heat sink secured to said first heat sink, a thin layer of electrical insulating material sandwiched between said heat sinks, said heat sinks being partially overlapped to provide a first surface on said first heat sink that is not covered by said second heat sink, said second heat sink having a finned portion that is not covered by said first heat sink that is adapted to be contacted by cooling air, said second heat sink having a second surface located adjacent said finned area that is axially spaced from said first surface of said first heat sink along an axis that is substantially normal to said first and second surfaces, a plurality of semiconductor diode chips each having one face thereof mounted on and connected respectively to said first and second axially spaced heat sink surfaces, said diodes being poled such that said heat sinks form direct voltage output terminals of opposite polarity, and a plurality of insulator blocks supported by said second heat sink overlapping said first surface of said first heat sink, each insulator block carrying an electrical connector that is adapted to be connected respectively to a phase winding of said generator, each electrical connector having a portion connected to faces of pairs of diodes mounted respectively on said first and second acially spaced heat sink surface, said layer of insulating material extending substantially coextensively with the overlapped surfaces of said heat sinks.

3. A polyphase bridge rectifier adapted to be fixed to the end frame of an alternating current generator comprising, a first metallic heat sink that is adapted to be mounted in direct metal-to-metal contact with a surface of a metallic end frame of said generator, a second metallic heat sink secured to said first heat sink, a thin layer of electrical insulating material sandwiched between said heat sinks, said heat sinks being partially overlapped to provide a first surface on said first heat sink that is not covered by said second heat sink, said second heat sink having a second surface that is axially spaced from said first surface of said first heat sink along an axis that is substantially normal to said first and second surfaces, a plurality of semiconductor diode chips each having one face thereof mounted on and connected respectively to said first and second axially spaced heat sink surfaces, said diodes being poled such that said heat sinks form direct voltage output terminals of opposite polarity, a plurality of insulator blocks supported by said second heat sink overlapping said first surface of said first heat sink, each insulator block carrying an electrical connector that is adapted to be connected respectively to a phase winding of said generator, each electrical connector having a portion connected to faces of pairs of diodes mounted respectively on said first and second axially spaced heat sink surface, said layer of insulating material extending substantially coextensively with the overlapped surfaces of said heat sinks, and a coating of insulating material covering each diode chip, said coating engaging and adhering to surface areas of said heat sinks adjacent each chip and portions of said electrical connectors that are connected to faces of said diode chips to thereby encapsulate a diode chip.

4. A polyphase bridge rectifier adapted to be fixed to the end frame of an alternating current generator comprising, a first arcuately extending heat sink that is formed of copper material that is adapted to be mounted in direct metal-to-metal contact with a surface of a metallic end frame of said generator, a second metallic heat sink formed of aluminum material secured to said first heat sink, a thin layer of electrical insulating material sandwiched between said heat sinks, said heat sinks being partially overlapped to provide a first surface on said first heat sink that is not covered by said second heat sink, said second heat sink having a finned portion that is not covered by said first heat sink that is adapted to be contacted by cooling air, said second heat sink having a second surface loated adjacent said finned area that is axially spaced from said first surface of said first heat sink along an axis that is substantially normal to said first and second surfaces, a plurality of semiconductor diode chips each having one face thereof mounted on and connected respectively to said first and second axially spaced heat sink surfaces, said diodes being poled such that said heat sinks form direct voltages output terminals of opposite polarity, a plurality of insulator blocks supported by said second heat sink overlapping said first surface of said first heat sink, each insulator block carrying an electrical connector that is adapted to be connected respectively to a phase winding of said generator, each electrical connector having a portion connected to faces of pairs of diodes mounted respectively on said first and second axially spaced heat sink surface, said layer of insulating material extending substantially coextensively with the overlapped surfaces of said heat sinks, and a coating of insulating material covering each diode chip, said coating engaging and adhering to surface areas of said heat sinks adjacent each chip and portions of said electrical connectors that are connected to faces of said chips to thereby encapsulate a diode chip.

5. A bridge rectifier for a diode-rectified alternating current generator comprising, a first metallic heat sink that is adapted to be mounted to a metallic end frame of said alternating current generator, a second metallic heat sink, means for electrically insulating said heat sinks from each other, first and second groups of diodes electrically connected respectively to said first and second heat sinks, said diodes being so poled that the heat sinks form positive and negative direct voltage output terminals, aligned openings in said heat sinks that are adapted to receive a metallic fastener for fastening the bridge rectifier to said end frame, insulating material carried by said second heat sink for electrically insulating said fastener from said second heat sink, and a metallic sleeve disposed within the opening in said second heat sink, said insulating material insulating said metallic sleeve from said second heat sink, said metallic sleeve engaging said metallic fastener and said first heat sink when said fastener is inserted into said sleeve to fasten said bridge rectifier to said end frame, said metallic sleeve ensuring an electrical connection between said metallic end frame and said first heat sink when said metallic fastener is inserted into said sleeve and said fastener is secured to said end frame.

6. A bridge rectifier adapted to be fixed to the end frame of an alternating current generator comprising, a first metallic heat sink that is adapted to be mounted in direct metal-to-metal contact with a surface of a metallic end frame of said generator, a second metallic heat sink secured to said first heat sink, means disposed between and in contact with said heat sinks for electrically insulating said heat sinks from each other, a plurality of diodes mounted on and electrically connected respectively to said first and second heat sinks, said diodes being poled such that said heat sinks form direct voltage output terminals of opposite polarity, and a plurality of insulator blocks supported by said second heat sink, each insulator block carrying an electrical connector that is adapted to be connected respectively to a phase winding of said generator, each electrical connector having portions electrically connecting pairs of diode mounted respectively on said first and second heat sinks, each insulator block having a dovetail-shaped portion that is disposed within a complementary dovetail-shaped slot formed in said second heat sink, said second heat sink having portions thereof staked into engagement with said insulator blocks for securing said insulator blocks to said second heat sink.

* * * * *